(12) United States Patent
Sawada et al.

(10) Patent No.: US 11,222,791 B2
(45) Date of Patent: Jan. 11, 2022

(54) PRINTED WIRING BOARD AND METHOD FOR MANUFACTURING PRINTED WIRING BOARD

(71) Applicant: IBIDEN CO., LTD., Ogaki (JP)

(72) Inventors: Yoji Sawada, Ogaki (JP); Nobuhisa Kuroda, Ogaki (JP); Kazuyuki Ueda, Ogaki (JP); Shota Tachibana, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/931,696

(22) Filed: May 14, 2020

(65) Prior Publication Data

US 2020/0365418 A1  Nov. 19, 2020

(30) Foreign Application Priority Data

May 16, 2019  (JP) ................. 2019-093066

(51) Int. Cl.
| H05K 1/18 | (2006.01) |
| H05K 1/11 | (2006.01) |
| H01L 21/48 | (2006.01) |
| H01L 23/498 | (2006.01) |
| H05K 3/46 | (2006.01) |

(Continued)

(52) U.S. Cl.
CPC ........ *H01L 21/4853* (2013.01); *H01L 21/486* (2013.01); *H01L 21/4857* (2013.01); *H01L 23/49816* (2013.01); *H01L 23/49822* (2013.01); *H01L 23/49827* (2013.01); *H01L 23/49866* (2013.01); *H05K 1/111* (2013.01); *H05K 1/181* (2013.01); *H05K 3/4644* (2013.01);

(Continued)

(58) Field of Classification Search
CPC .......... H01L 21/4853; H01L 23/49827; H01L 23/49866; H01L 23/49816; H01L 23/49822; H01L 21/4857; H01L 21/486; H01L 2224/16238; H01L 24/16; H05K 1/181; H05K 3/4644; H05K 2201/10159
See application file for complete search history.

(56) References Cited

U.S. PATENT DOCUMENTS

| 5,487,999 A * | 1/1996 | Farnworth ........... G01R 1/0483 216/18 |
| 6,518,781 B2 * | 2/2003 | Masuda ............. G01R 1/06761 324/754.07 |

(Continued)

FOREIGN PATENT DOCUMENTS

JP  2015-195305 A  11/2015

*Primary Examiner* — Ishwarbhai B Patel
(74) *Attorney, Agent, or Firm* — Oblon, McClelland, Maier & Neustadt, L.L.P.

(57) ABSTRACT

A printed wiring board includes a resin insulating layer, a metal post formed in the resin insulating layer such that the metal post is protruding from a first surface of the resin insulating layer, a conductor layer formed on a second surface of the resin insulating layer on the opposite side with respect to the first surface of the resin insulating layer, and a via conductor formed in the resin insulating layer such that the via conductor is penetrating through the resin insulating layer and connecting the metal post and the conductor layer. The metal post has a protruding portion protruding from the first surface of the resin insulating layer and an embedded portion integrally formed with the protruding portion and embedded in the resin insulating layer.

20 Claims, 4 Drawing Sheets

(51) Int. Cl.
*H01L 23/00* (2006.01)
*H05K 1/02* (2006.01)

(52) U.S. Cl.
CPC .... *H01L 24/16* (2013.01); *H01L 2224/16238* (2013.01); *H05K 1/0298* (2013.01); *H05K 2201/10159* (2013.01)

(56) References Cited

U.S. PATENT DOCUMENTS

| | | | | |
|---|---|---|---|---|
| 6,809,415 B2* | 10/2004 | Tsukada | ............... | H05K 3/3452 |
| | | | | 257/693 |
| 2009/0183906 A1* | 7/2009 | Kobayashi | .......... | H01L 23/3114 |
| | | | | 174/260 |
| 2009/0183910 A1* | 7/2009 | Sunohara | .......... | H01L 23/49827 |
| | | | | 174/266 |
| 2010/0006334 A1* | 1/2010 | Takenaka | ............. | H05K 3/4682 |
| | | | | 174/262 |
| 2010/0163293 A1* | 7/2010 | Kawai | .................. | H05K 3/4682 |
| | | | | 174/261 |
| 2010/0263923 A1* | 10/2010 | Kodani | .................. | H05K 1/111 |
| | | | | 174/260 |
| 2011/0232943 A1* | 9/2011 | Hida | ....................... | H05K 3/465 |
| | | | | 174/251 |
| 2012/0222894 A1* | 9/2012 | Kaneko | ............. | H01L 23/49811 |
| | | | | 174/257 |
| 2013/0126799 A1* | 5/2013 | Naoi | ..................... | H01L 51/444 |
| | | | | 252/514 |
| 2015/0008020 A1* | 1/2015 | Kaneko | ................... | H05K 3/465 |
| | | | | 174/257 |
| 2015/0282307 A1* | 10/2015 | Shimizu | .............. | H01L 23/5383 |
| | | | | 174/264 |
| 2018/0130759 A1* | 5/2018 | Ho | .......................... | H01L 24/81 |

\* cited by examiner

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2019-093066, filed May 16, 2019, the entire contents of which are incorporated herein by reference.

BACKGROUND OF THE INVENTION

Field of the Invention

The present invention relates to a printed wiring board having a metal post, and a method for manufacturing the printed wiring board.

Description of Background Art

Japanese Patent Application Laid-Open Publication No. 2015-195305 describes a printed wiring board having a conductor post. The entire contents of this publication are incorporated herein by reference.

SUMMARY OF THE INVENTION

According to one aspect of the present invention, a printed wiring board includes a resin insulating layer, a metal post formed in the resin insulating layer such that the metal post is protruding from a first surface of the resin insulating layer, a conductor layer formed on a second surface of the resin insulating layer on the opposite side with respect to the first surface of the resin insulating layer, and a via conductor formed in the resin insulating layer such that the via conductor is penetrating through the resin insulating layer and connecting the metal post and the conductor layer. The metal post has a protruding portion protruding from the first surface of the resin insulating layer and an embedded portion integrally formed with the protruding portion and embedded in the resin insulating layer.

According to another aspect of the present invention, a method for manufacturing a printed wiring board includes forming a metal post on a copper foil, forming a resin insulating layer on the copper foil such that the metal post is embedded in the resin insulating layer and that the copper foil faces a first surface of the resin insulating layer, forming an opening for a via conductor in the resin insulating layer such that the opening penetrates through the resin insulating layer and reaches the metal post, forming a conductor layer on a second surface of the resin insulating layer on the opposite side with respect to the first surface of the resin insulating layer, forming the via conductor in the opening formed in the resin insulating layer such that the via conductor connects the metal post and the conductor layer, removing the copper foil from the resin insulating layer such that the first surface of the resin insulating layer and the metal post are exposed, and removing a portion of the resin insulating layer from the first surface toward the second surface of the resin insulating layer such that the resin insulating layer is thinned and that a portion of the metal post protrudes from the first surface of the resin insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
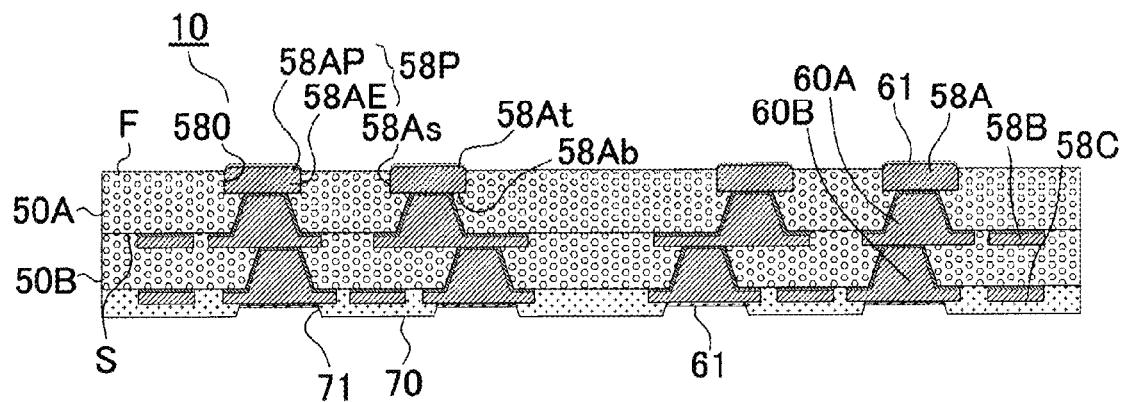
FIG. 1A is a cross-sectional view of a printed wiring board of an embodiment.

Embodiments will now be described with reference to the accompanying drawings, wherein like reference numerals designate corresponding or identical elements throughout the various drawings.

FIG. 1A illustrates a cross section of a printed wiring board 10 of an embodiment. As illustrated in FIG. 1A, the printed wiring board 10 includes: a first resin insulating layer (50A) having a first surface (F) and a second surface (S) on an opposite side with respect to the first surface (F); metal posts (58P) formed on the first surface (F) of the first resin insulating layer (50A); a second conductor layer (58B) formed on the second surface (S) of the first resin insulating layer (50A); and first via conductors (60A) that penetrate the first resin insulating layer (50A) and connect the metal posts (58P) to the second conductor layer (58B). In the example of FIG. 1A, the printed wiring board 10 further includes: a second resin insulating layer (50B) formed on the second surface (S) of the first resin insulating layer (50A) and on the second conductor layer (58B); a third conductor layer (58C) formed on the second resin insulating layer (50B); and second via conductors (60B) that penetrate the second resin insulating layer (50B) and connect the second conductor layer (58B) and the third conductor layer (58C) to each other. The second resin insulating layer (50B) has a third surface and a fourth surface on an opposite side with respect to the third surface. The second surface (S) and the third surface face each other. The third conductor layer (58C) is formed on the fourth surface.

The printed wiring board 10 can further include a solder resist layer 70 on the fourth surface of the second resin insulating layer (50B) and on the third conductor layer (58C). The solder resist layer 70 has openings 71 exposing the third conductor layer (58C).

In FIG. 1A, the first surface (F) of the first resin insulating layer (50A) is exposed. That is, the printed wiring board 10 in FIG. 1A does not have a solder resist layer on the first surface (F). However, the printed wiring board 10 can have a solder resist layer having openings exposing the metal posts (58P) on the first surface (F).

The first resin insulating layer (50A) has recesses 580 on the first surface (F) side. A first conductor layer (58A) including the metal posts (58P) is formed in the recesses 580. As illustrated in FIG. 1A, the metal posts (58P) included in the first conductor layer (58A) are each formed to include a portion (58AE) formed in a recess 580 and a portion (protruding portion) (58AP) protruding from the first surface (F) of the first resin insulating layer (50A). The portion (58AE) formed in the recesses 580 is embedded in the first resin insulating layer (50A). The portion (58AE) is an embedded portion. The embedded portion (58AE) and the protruding portion (58AP) are integrally formed. The embedded portion (58AE) and the protruding portion (58AP) are continuous. There is no interface between the embedded portion (58AE) and the protruding portion (58AP). Since the metal posts (58P) are protruding, the metal posts (58P) are susceptible to a stress. However, since the embedded portion (58AE) and the protruding portion (58AP) are continuous, connection reliability between the two portions is unlikely to decrease.

The metal posts (58P) each have an upper surface (58At) and a lower surface (58Ab) on an opposite side with respect to the upper surface (58At). The lower surfaces (58Ab) respectively reach the first via conductors (60A). FIG. 1A illustrates a view obtained by cutting the printed wiring board 10 along a plane perpendicular to the upper surface (58At).

Figure 4A:
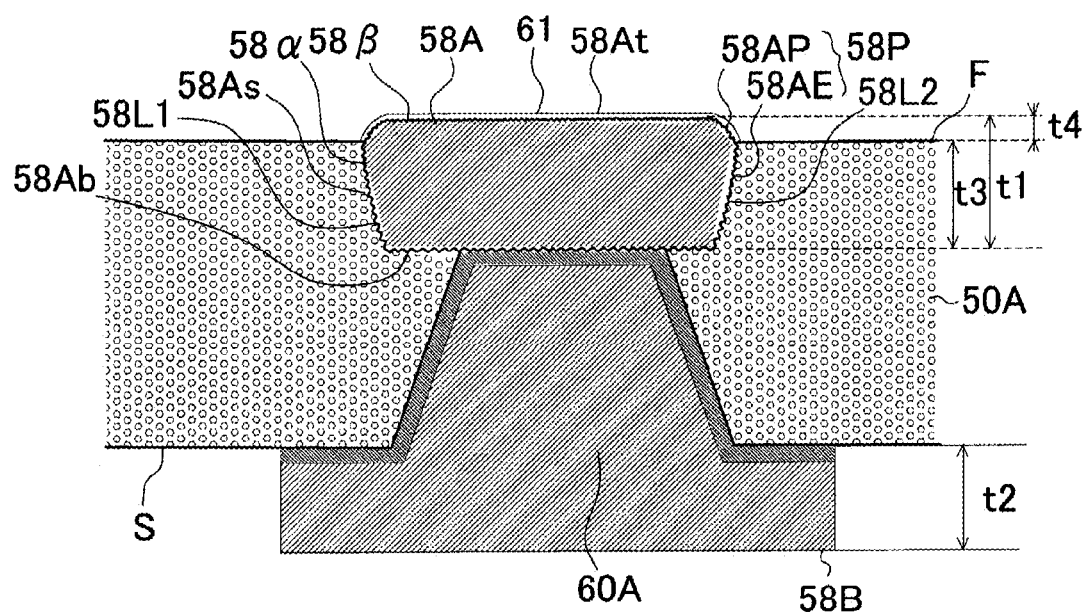
FIG. 4A illustrates a portion of the printed wiring board of FIG. 1A.

FIG. 4A illustrates a portion of FIG. 1A. As illustrated in FIG. 4A, the metal posts (58P) each have a first side wall (58L1) and a second side wall (58L2) between the upper surface (58At) and the lower surface (58Ab). The first side wall (58L1) and the second side wall (58L2) have unevenness (58α). A side surface (58As) of each of the metal posts (58P) has the unevenness (58α). It is also possible that only the side surface (58As) of the embedded portion (58AE) has the unevenness (58α). Even when a stress is transmitted via the protruding portion (58AP) to the embedded portion (58AE), peeling is unlikely to occur between each of the metal posts (58P) and the first resin insulating layer (50A).

Each of the metal posts (58P) can have unevenness (58β) on the upper surface (58At) of the protruding portion (58AP). Each of the metal posts (58P) can have unevenness (58α) on the lower surface (58Ab) of the embedded portion (58AE). The unevenness (58β) on the upper surface (58At) and the unevenness (58α) on the side surface of each of the metal posts (58P) are separately formed.

As illustrated in FIG. 4A, the protruding portion (58AP) has a height (t4). The height (t4) is a distance between the upper surface (58At) and the first surface (F). The height (t4) is 3 μm or more. Connection reliability between the printed wiring board 10 and an electronic component 90 can be increased. The height (t4) is 10 μm or less. Deformation of the protruding portion (58AP) can be reduced during heat cycles. Reliability of the printed wiring board 10 can be maintained for a long time. The height (t4) is 3 μm or more and 10 μm or less. Even when four or more electronic components are mounted on the printed wiring board 10, connection reliability between each electronic component 90 and the printed wiring board 10 can be increased.

As illustrated in FIG. 4A, the embedded portion (58AE) has a thickness (t3). The thickness (t3) is a distance between the first surface (F) and the lower surface (58Ab). The thickness (t3) is larger than the height (t4) (Relation 1). A thermal expansion coefficient of the printed wiring board 10 and a thermal expansion coefficient of the electronic component 90 are different. Due to the difference in thermal expansion coefficient between the two, the protruding portion (58AP) is susceptible to deformation. However, since the printed wiring board 10 has Relation 1, the embedded portion (58AE) can suppress the deformation of the protruding portion (58AP).

As illustrated in FIG. 4A, the metal posts (58P) each have a thickness (t1). The second conductor layer (58B) has a thickness (t2). The thickness (t2) and the thickness (t3) are substantially equal to each other. When the thickness (t3) and the thickness (t2) are equal to each other, an uneven stress in the printed wiring board can be prevented.

The thickness (t1) is larger than the thickness (t2). Therefore, the first surface (F) side of the printed wiring board 10 is strengthened. Flatness of the first surface (F) can be increased. The upper surfaces (58At) of the protruding portions (58AP) can be positioned on the same plane. An electronic component 90 can be easily mounted on the printed wiring board 10. Connection reliability between the printed wiring board 10 and an electronic component 90 can be increased. Even when four or more electronic components are mounted on the printed wiring board 10, connection reliability between the printed wiring board 10 and each electronic component 90 can be maintained for a long time.

As illustrated in FIG. 4A, a distance between the first side wall (58L1) of the embedded portion (58AE) and the second side wall (58L2) of the embedded portion (58AE) gradually decreases from the first surface (F) toward the lower surface (58Ab). And, a first via conductor (60A) connected to the lower surface (58Ab) gradually becomes thinner from the second surface (S) toward the lower surface (58Ab). In this way, the embedded portions (58AE) and the first via conductors (60A) are embedded in the first resin insulating layer (50A), and are reduced in diameter toward the lower surfaces (58Ab). Therefore, the conductors embedded in the first resin insulating layer (50A) are formed in good balance. The heights (t4) of the protruding portions (58AP) are likely to match each other. The upper surfaces (58At) of the protruding portions (58AP) are likely to be positioned at the same position.

As illustrated in FIG. 4A, the first side wall (58L1) of the protruding portion (58AP) and the second side wall (58L2) of the protruding portion (58AP) are bent from the upper surface (58At) toward the first surface (F). The first side wall (58L1) and second side wall (58L2) of the protruding portion (58AP) expand outward. A distance between the first side wall (58L1) and the second side wall (58L2) at the position of the upper surface (58At) is smaller than a distance between the first side wall (58L1) and the second side wall (58L2) at the position of the first surface (F). When the side surface of the protruding portion (58AP) has the shape illustrated in FIG. 4A, a stress transmitted via the side surface of the protruding portion (58AP) is not transmitted to the first resin insulating layer (50A) in a shortest distance. A crack is unlikely to occur in the first resin insulating layer (50A).

Figure 4B:
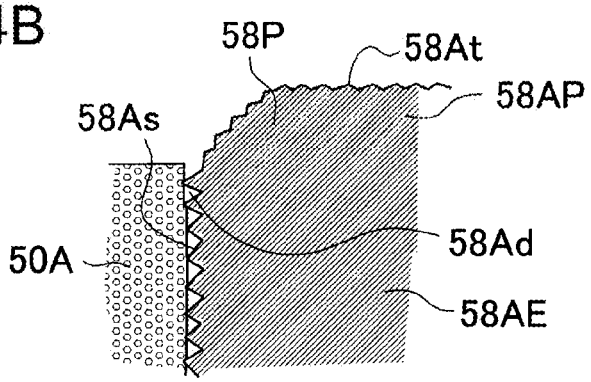
FIG. 4B is an enlarged view of a metal post.

FIG. 4B is an enlarged view of a metal post (58P). In the example of FIG. 4B, the printed wiring board 10 has a gap (58Ad) between the side surface of each of the embedded portions (58AE) and the first resin insulating layer (50A). Due to the gaps (58Ad), a stress from the metal posts (58P) to the first resin insulating layer (50A can be reduced in magnitude. A crack is unlikely to occur in the first resin insulating layer (50A). The gap (58Ad) is along the side surface (58As) of the embedded portion (58AE). The gap (58Ad) extends from the first surface (F) to the lower surface (58Ab). Or, the gap (58Ad) extends from the first surface (F) to a position around the middle between the first surface (F) and the lower surface (58Ab).

As illustrated in FIG. 4A, a corrosion resistant layer 61 is formed on the upper surface (58At) and the side surface of the protruding portion (58AP). An example of the corrosion resistant layer 61 is a Ni/Pd/Au layer. The Ni/Pd/Au layer includes a Ni layer, a Pd layer on the Ni layer and an Au layer on Pd layer, and the Ni layer is formed on the upper surface (58At). Another example of the corrosion resistant layer 61 is a Ni/Au layer.

When the printed wiring board 10 has the gap (58Ad), the corrosion resistant layer 61 extends into the gap (58Ad). Therefore, water is unlikely to accumulate in the gap (58Ad). A decrease in insulation reliability of the printed wiring board 10 can be prevented.

Figure 1B:
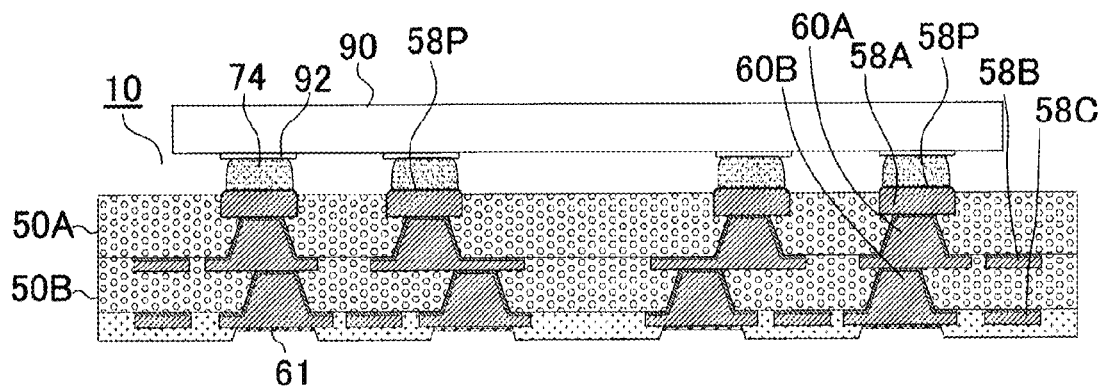
FIG. 1B is a cross-sectional view of an application example.

FIG. 1B illustrates an application example of the printed wiring board 10 of the embodiment. As illustrated in FIG. 1B, the printed wiring board 10 can have solder bumps 74 respectively on the metal posts (58P). An electronic component 90 is mounted on the printed wiring board 10 via the solder bumps 74. Electrodes 92 of the electronic component 90 are respectively connected to the metal posts (58P) by the solder bumps 74.

Manufacturing Method of Embodiment

A method for manufacturing the printed wiring board of the embodiment is illustrated in FIGS. 2A-2C and 3A-3C.

Figure 2A:
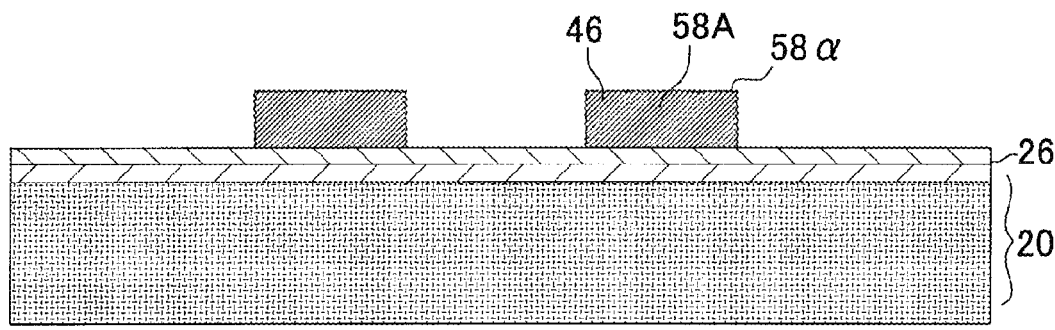
FIGS. 2A-2C are manufacturing process diagrams of the printed wiring board of the embodiment.
Figure 2B:
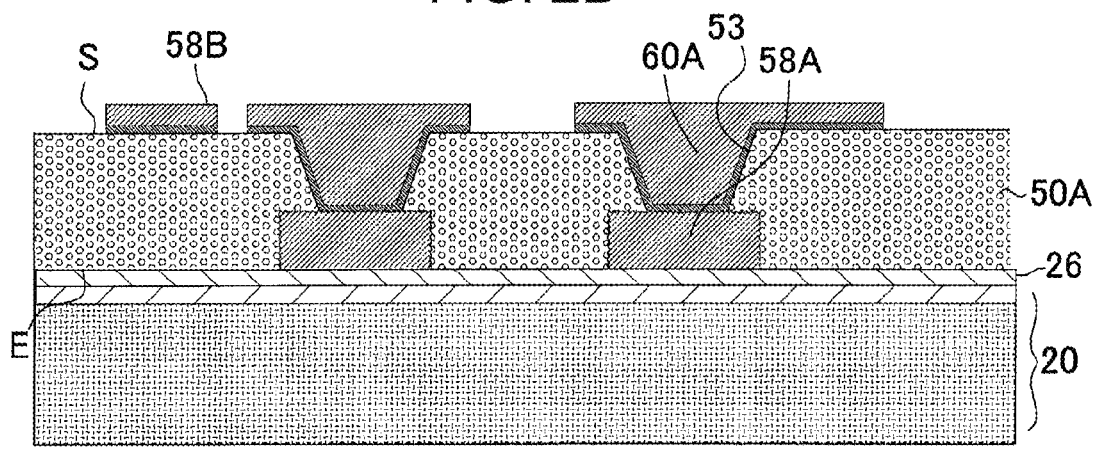
Figure 2C:
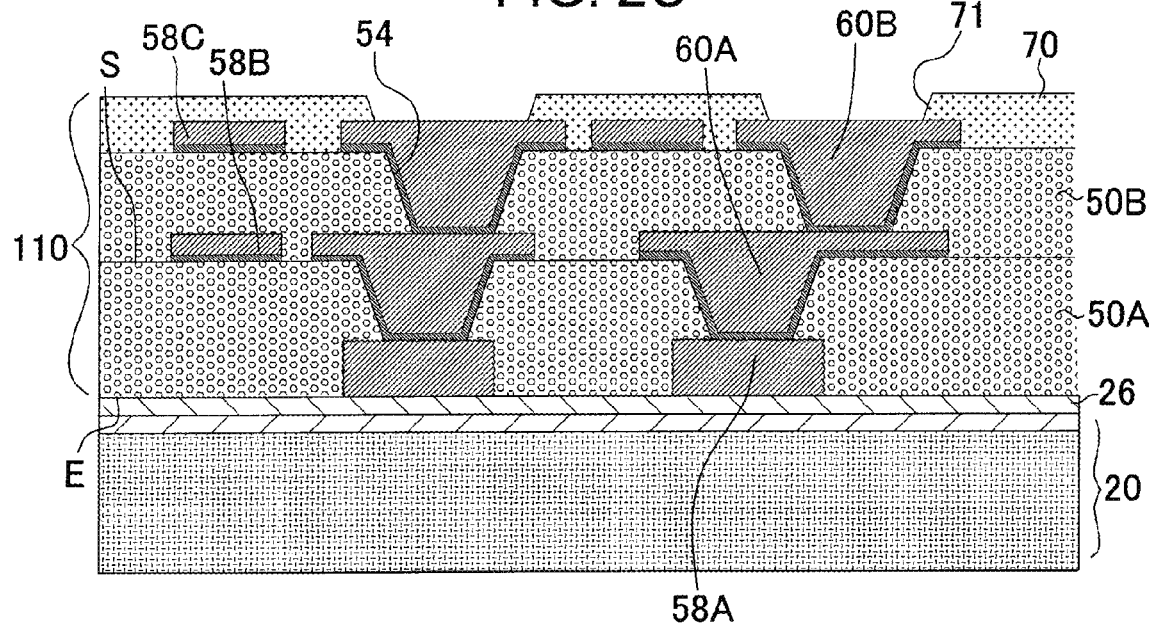

A copper-clad laminate 20 and a copper foil 26 are prepared. The copper foil 26 is laminated on the copper-clad laminate 20. A plating resist is formed on the copper foil 26. The first conductor layer (58A) formed of an electrolytic copper plating film 46 is formed on the copper foil 26 exposed from the plating resist by electrolytic plating. The plating resist is removed. Unevenness (58α) is formed on the surface of the first conductor layer (58A) (FIG. 2A). The first resin insulating layer (50A) having an exposed surface (E) and a second surface (S) on an opposite side with respect to the exposed surface (E) is prepared. The first resin insulating layer (50A) is laminated on the copper foil 26 such that the exposed surface (E) and the copper foil 26 face each other. In this case, the first conductor layer (58A) is embedded in the first resin insulating layer (50A). First openings 53 for the first via conductors (60A) penetrating the first resin insulating layer (50A) and reaching the first conductor layer (58A) are formed. Next, the second conductor layer (58B) is formed on the second surface (S) of the first resin insulating layer (50A) using a semi-additive method. At the same time, the first via conductors (60A) connecting the second conductor layer (58B) and the first conductor layer (58A) to each other are respectively formed in the first openings 53 (FIG. 2B). The second resin insulating layer (50B) is formed on the second surface (S) of the first resin insulating layer (50A) and on the second conductor layer (58B). After that, second openings 54 for the second via conductors (60B) penetrating the second resin insulating layer (50B) and reaching the second conductor layer (58B) are formed. Next, the third conductor layer (58C) is formed on the second resin insulating layer (50B) using a semi-additive method. At the same time, the second via conductors (60B) connecting the second conductor layer (58B) and the third conductor layer (58C) to each other are formed in the second openings 54. The solder resist layer 70 is formed on the second resin insulating layer (50B) and the third conductor layer (58C) (FIG. 2C). The solder resist layer 70 has the openings 71 exposing the third conductor layer (58C). An intermediate 110 illustrated in FIG. 2C is formed on the copper foil 26.

Figure 3A:
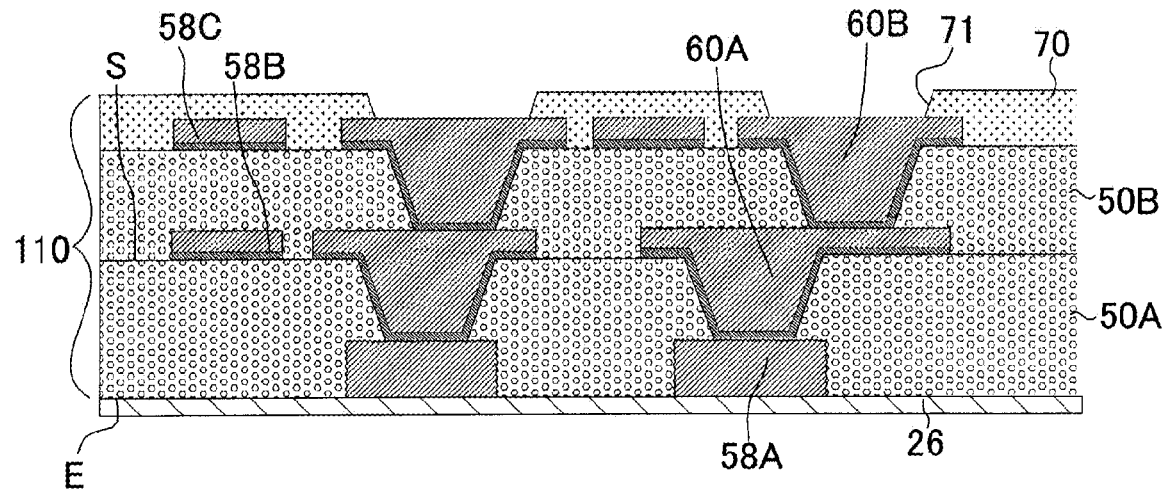
FIGS. 3A-3C are manufacturing process diagrams of the printed wiring board of the embodiment.
Figure 3B:
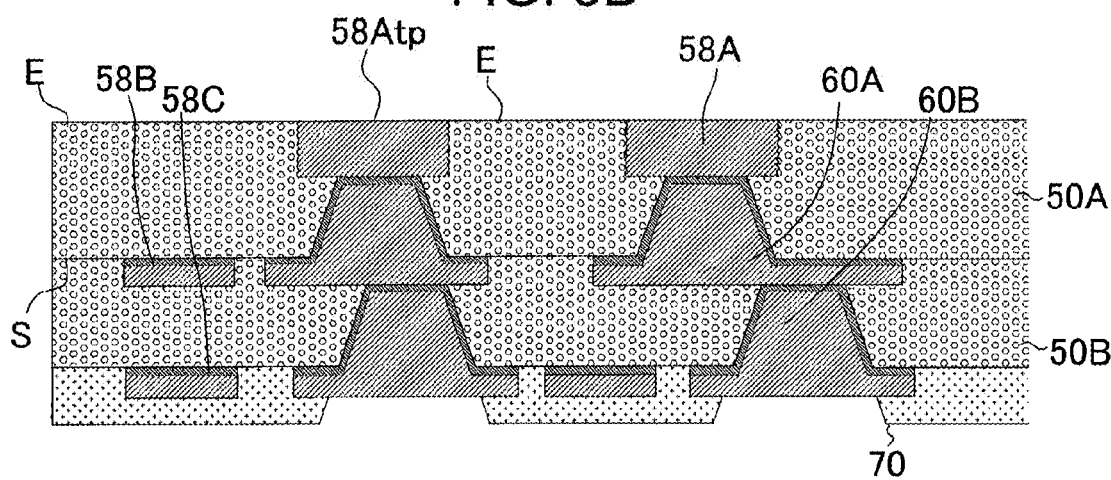

The intermediate 110 is separated from the copper-clad laminate 20 (FIG. 3A). The copper foil 26 is removed by etching (FIG. 3B). The exposed surface (E) of the first resin insulating layer (50A) and the top surface (58Atp) of the first conductor layer (58A) are exposed. The top surface (58Atp) of the first conductor layer (58A) is a surface in contact with the copper foil 26.

Figure 3C:
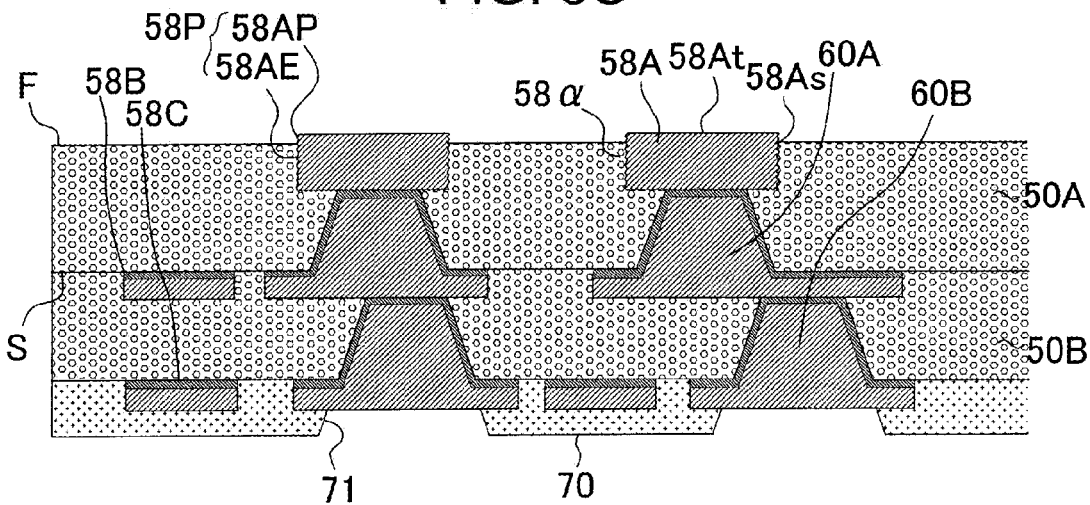

By removing the exposed surface (E) a portion of the first resin insulating layer (50A) is removed (FIG. 3C). The thickness of the first resin insulating layer (50A) is reduced. The first resin insulating layer (50A) having the first surface (F) on an opposite side with respect to the second surface (S) is formed. A portion of the first conductor layer (58A) protrudes from the first surface (F) of the first resin insulating layer (50A). The metal posts (58P) each including of the protruding portion (58AP) (having the upper surface (58At)) and the embedded portion (58AE) are formed. Examples of methods for removing the exposed surface (E) include plasma processing and blast processing. An example of a gas used in the plasma processing is a gas containing CF4 and O2. The corrosion resistant layer 61 is formed on the upper surface (58At) and the side surface (58As) of the protruding portion (58AP). At the same time, the corrosion resistant layer 61 is formed on the third conductor layer (58C) exposed from the openings 71 of the solder resist layer 70. The printed wiring board 10 illustrated in FIG. 1A is completed. The solder bumps 74 can be respectively formed on the metal posts (58P). An electronic component 90 is mounted on the metal posts (58P) via the solder bumps 74 (FIG. 1B). Examples of the electronic component 90 include an IC chip and a memory. Four or more memories can be mounted around an IC chip. In this case, five or more electronic components are mounted on the printed wiring board 10 of the embodiment.

Figure 1C:
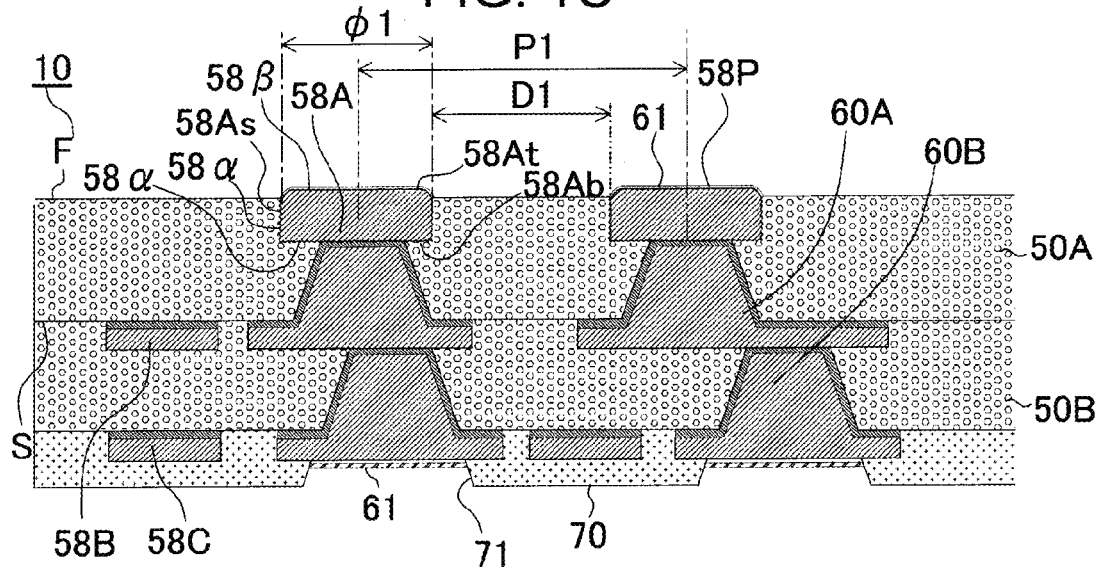
FIG. 1C illustrates a diameter of a metal post, a pitch between adjacent metal posts, and a distance between adjacent metal posts.

FIG. 1C illustrates a diameter ($\varphi 1$) of each of the metal posts (58P), a pitch (P1) between adjacent metal posts (58P), and a distance (insulation interval) (D1) between adjacent metal posts (58P). The diameter ($\varphi 1$) of each of the metal posts (58P) is 25 μm or more and 50 μm or less. The pitch (P1) between adjacent metal posts (58P) is 60 μm or more and 90 μm or less. The insulation interval (D1) between adjacent metal posts (58P) is 25 μm or more and 45 μm or less. The diameter ($\varphi 1$) and the insulation interval (D1) are measured at the position of the first surface (F).

The number of the resin insulating layers and the number of the conductor layers may each be 3 or more.

The metal posts (58P) are included in the first conductor layer (58A). Therefore, the first conductor layer (58A) and the metal posts (58P) are the same.

According to FIG. 6G of Japanese Patent Application Laid-Open Publication No. 2015-195305, the conductor post 35 is formed on a mounting pattern 25 embedded in a resin insulating layer 11. The conductor post 35 of Japanese Patent Application Laid-Open Publication No. 2015-195305 is formed of a metal layer 32, a first metal film 33, and a second metal film 34. In this way, the conductor post 35 of Japanese Patent Application Laid-Open Publication No. 2015-195305 is formed of multiple members. Therefore, there is an interface in the conductor post 35 of the printed wiring board of Japanese Patent Application Laid-Open Publication No. 2015-195305. When an electronic component is mounted on the printed wiring board of Japanese Patent Application Laid-Open Publication No. 2015-195305 via the conductor post 35, since the electronic component and the printed wiring board have different thermal expansion coefficients, it is thought that the conductor post 35 is subjected to a large stress. The stress is expected to concentrate on the interface in the conductor post 35. Therefore, resistance of the conductor post 35 is expected to increase. Further, the conductor post 35 and the mounting pattern 25 are not integrally formed. Therefore, connection reliability between the conductor post 35 and the mounting pattern 25 is expected to decrease.

A printed wiring board according to an embodiment of the present invention includes: a first resin insulating layer having a first surface and a second surface on an opposite side with respect to the first surface; a metal post formed by a portion (protruding portion) protruding from the first surface of the first resin insulating layer and a portion (embedded portion) that is connected to the protruding portion and is embedded in the first resin insulating layer; a second conductor layer formed on the second surface of the first resin insulating layer; and a first via conductor that penetrates the first resin insulating layer and connects the metal post to the second conductor layer. The protruding portion and the embedded portion are integrally formed.

A method for manufacturing a printed wiring board according to another embodiment of the present invention includes: forming a metal post on a copper foil; preparing a first resin insulating layer having an exposed surface and a second surface on an opposite side with respect to the exposed surface; embedding the metal post in the first resin insulating layer by forming the first resin insulating layer on the copper foil such that the copper foil and the exposed surface face each other; forming a first opening for a first via conductor penetrating the first resin insulating layer and reaching the metal post; forming a second conductor layer on the second surface of the first resin insulating layer; forming the first via conductor that connects the metal post and the second conductor layer to each other in the first opening; exposing the exposed surface of the first resin insulating layer and the metal post by removing the copper foil; and thinning the first resin insulating layer by removing the exposed surface of the first resin insulating layer. The thinning includes forming a first surface on an opposite side with respect to the second surface, and, due to the thinning, a portion of the metal post protrudes from the first surface.

According to an embodiment of the present invention, the metal post protrudes from the first resin insulating layer. An amount of solder on the metal post can be reduced. The metal post and an electronic component can be connected with a small amount of solder. Therefore, a distance between adjacent metal posts can be reduced. Even when the distance between adjacent metal posts is small, a short circuit is unlikely to occur between adjacent metal posts.

The protruding portion and the embedded portion are integrally formed. The protruding portion and the embedded portion are continuous. There is no interface between the protruding portion and the embedded portion. Therefore, even when an electronic component is mounted on the printed wiring board of the embodiment via the metal post, connection reliability between the printed wiring board of the embodiment and the electronic component is unlikely to decrease. Even when four or more electronic components are mounted on the printed wiring board of the embodiment, connection reliability is unlikely to decrease.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a resin insulating layer;
   a metal post formed in the resin insulating layer such that the metal post is protruding from a first surface of the resin insulating layer;
   a conductor layer formed on a second surface of the resin insulating layer on an opposite side with respect to the first surface of the resin insulating layer; and
   a via conductor formed in the resin insulating layer such that the via conductor is penetrating through the resin insulating layer and connecting the metal post and the conductor layer,
   wherein the metal post has a protruding portion protruding from the first surface of the resin insulating layer and an embedded portion integrally formed with the protruding portion and embedded in the resin insulating layer such that a surface of the protruding portion has unevenness that is different from unevenness formed on a surface of the embedded portion and that the metal post has an upper surface and a lower surface on an opposite side with respect to the upper surface, and the embedded portion has a side surface in contact with the resin insulating layer such that the unevenness of the surface of the embedded portion is forming a plurality of gaps between the side surface of the embedded portion and the resin insulating layer and that the plurality of gaps is extending from the first surface of the resin insulating layer to at least a middle position between the first surface of the resin insulating layer and the lower surface of the metal post.

2. The printed wiring board according to claim 1, wherein the metal post has an upper surface and a lower surface on an opposite side with respect to the upper surface such that the via conductor is extending to the lower surface and that the upper surface is configured to mount an electronic component thereon.

3. The printed wiring board according to claim 2, wherein the metal post has a corrosion resistant layer formed on the upper surface of the metal post.

4. The printed wiring board according to claim 3, further comprising:
   a solder bump formed on the corrosion resistant layer.

5. The printed wiring board according to claim 3, wherein the corrosion resistant layer includes a Ni layer formed on the upper surface of the metal post, a Pd layer formed on the Ni layer, and an Au layer formed on the Pd layer.

6. The printed wiring board according to claim 2, wherein the metal post is formed such that a height of the protruding portion between the upper surface of the metal post and the first surface of the resin insulating layer is 3 µm or more.

7. The printed wiring board according to claim 6, wherein the metal post is formed such that the height of the protruding portion is 10 µm or less.

8. The printed wiring board according to claim 2, wherein the metal post is formed such that a cut cross section of the metal post cut along a plane perpendicular to the upper surface has a distance between a first side wall and a second side wall gradually decreasing from the first surface of the resin insulating layer toward the lower surface of the metal post.

9. The printed wiring board according to claim 8, wherein the metal post is formed such that the first and second side walls have the unevenness of the surface of the embedded portion.

10. The printed wiring board according to claim 8, wherein the metal post is formed such that the first side wall and the second side wall are bent from the upper surface of the metal post toward the first surface of the resin insulating layer.

11. The printed wiring board according to claim 2, wherein the metal post is formed such that a thickness of the embedded portion is substantially equal to a thickness of the conductor layer.

12. The printed wiring board according to claim 11, wherein the metal post is formed such that a height of the protruding portion between the upper surface of the metal post and the first surface of the resin insulating layer is 3 μm or more.

13. The printed wiring board according to claim 12, wherein the metal post is formed such that the height of the protruding portion is 10 μm or less.

14. The printed wiring board according to claim 11, wherein the metal post is formed such that a cut cross section of the metal post cut along a plane perpendicular to the upper surface has a distance between a first side wall and a second side wall gradually decreasing from the first surface of the resin insulating layer toward the lower surface of the metal post.

15. The printed wiring board according to claim 14, wherein the metal post is formed such that the first and second side walls have the unevenness of the surface of the embedded portion.

16. The printed wiring board according to claim 14, wherein the metal post is formed such that the first side wall and the second side wall are bent from the upper surface of the metal post toward the first surface of the resin insulating layer.

17. The printed wiring board according to claim 1, wherein the metal post is formed such that a thickness of the embedded portion is substantially equal to a thickness of the conductor layer.

18. The printed wiring board according to claim 1, wherein the metal post is formed such that the plurality of gaps is extending from the first surface of the resin insulating layer to the middle position between the first surface of the resin insulating layer and the lower surface of the metal post.

19. A method for manufacturing a printed wiring board, comprising:
   forming a metal post on a copper foil;
   forming a resin insulating layer on the copper foil such that the metal post is embedded in the resin insulating layer and that the copper foil faces a first surface of the resin insulating layer;
   forming an opening for a via conductor in the resin insulating layer such that the opening penetrates through the resin insulating layer and reaches the metal post;
   forming a conductor layer on a second surface of the resin insulating layer on an opposite side with respect to the first surface of the resin insulating layer;
   forming the via conductor in the opening formed in the resin insulating layer such that the via conductor connects the metal post and the conductor layer;
   removing the copper foil from the resin insulating layer such that the first surface of the resin insulating layer and the metal post are exposed; and
   removing a portion of the resin insulating layer from the first surface toward the second surface of the resin insulating layer such that the resin insulating layer is thinned and that a portion of the metal post protrudes from the first surface of the resin insulating layer,
   wherein the metal post has a protruding portion protruding from the first surface of the resin insulating layer and an embedded portion integrally formed with the protruding portion and embedded in the resin insulating layer such that a surface of the protruding portion has unevenness formed by the removing of the portion of the resin insulating layer that is different from unevenness formed on a surface of the embedded portion formed by the forming of the metal post and that the metal post has an upper surface and a lower surface on an opposite side with respect to the upper surface, and the embedded portion has a side surface in contact with the resin insulating layer such that the unevenness of the surface of the embedded portion is forming a plurality of gaps between the side surface of the embedded portion and the resin insulating layer and that the plurality of gaps is extending from the first surface of the resin insulating layer to at least a middle position between the first surface of the resin insulating layer and the lower surface of the metal post.

20. The method for manufacturing a printed wiring board according to claim 19, wherein the metal post has an upper surface and a lower surface on an opposite side with respect to the upper surface such that the via conductor extends to the lower surface and that the upper surface is configured to mount an electronic component thereon, and the forming of the metal post comprises forming the metal post such that a cut cross section of the metal post has a first side wall and a second side wall gradually decreasing a distance between the first side wall and the second side wall from the first surface of the resin insulating layer toward the lower surface of the metal post.

* * * * *